(12) United States Patent
Frank

(10) Patent No.: US 6,879,224 B2
(45) Date of Patent: Apr. 12, 2005

(54) INTEGRATED FILTER AND IMPEDANCE MATCHING NETWORK

(75) Inventor: Michael L. Frank, Los Gatos, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 51 days.

(21) Appl. No.: 10/242,246

(22) Filed: Sep. 12, 2002

(65) Prior Publication Data
US 2004/0051601 A1 Mar. 18, 2004

(51) Int. Cl.[7] .................. H03H 9/54; H03H 9/64
(52) U.S. Cl. ........................... 333/189; 333/193
(58) Field of Search ..................... 333/186–196

(56) References Cited

U.S. PATENT DOCUMENTS

| | | | | |
|---|---|---|---|---|
| 1,795,204 A | * | 3/1931 | Espenschied | 333/189 |
| 1,808,524 A | * | 6/1931 | Byrnes | 333/187 |
| 3,179,906 A | * | 4/1965 | Turvey | 333/189 |
| 4,954,793 A | * | 9/1990 | Misu et al. | 333/133 |
| 5,151,672 A | | 9/1992 | Noto et al. | 333/189 |
| 5,382,930 A | | 1/1995 | Stokes et al. | 333/191 |
| 6,404,302 B1 | * | 6/2002 | Satoh et al. | 333/193 |

FOREIGN PATENT DOCUMENTS

| | | | |
|---|---|---|---|
| EP | 1126604 | | 1/2001 |
| EP | 1231713 | | 7/2002 |
| GB | 2287580 | | 2/1995 |
| JP | 6-260876 | * | 9/1994 |
| JP | 7-231241 | * | 8/1995 |
| JP | 8-32402 | * | 2/1996 |
| JP | 10-65489 | * | 3/1998 |
| JP | 10-65490 | * | 3/1998 |
| JP | 2000151341 | | 5/2000 |
| JP | 2001-151356 | * | 5/2000 |
| JP | 2002217680 | | 8/2002 |
| WO | WO 03/052930 | | 6/2003 |

* cited by examiner

Primary Examiner—Barbara Summons
(74) Attorney, Agent, or Firm—Pamela Lau Kee

(57) ABSTRACT

A filter and impedance matching network uses acoustic resonators in place of capacitors. A resonator, e.g. FBAR, behaves similar to a capacitor outside of its resonant frequency and so does not impact the function of the network, outside of its resonant frequency. At this resonant frequency, the resonator quickly transitions from capacitor to short circuit to open circuit and back to capacitor. Thus, the will deliver open and short circuits independent of the standard LC filter resulting in a structure with an additional notch, a notch with the characteristics delivered by a very high quality resonator. This notch can be much sharper and closer to the pass band than is possible with ordinary inductors and capacitors.

2 Claims, 7 Drawing Sheets

AN ALL PASS OR LOW PASS FILTER

AN ALL PASS/LOWPASS NOTCH COMBINATION $f_0 = 1/(2\pi \sqrt{LC})$

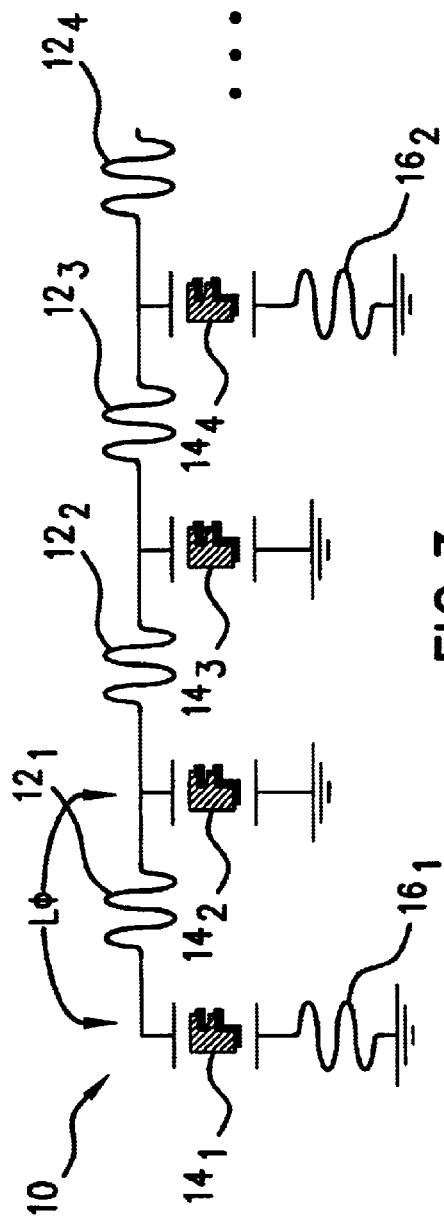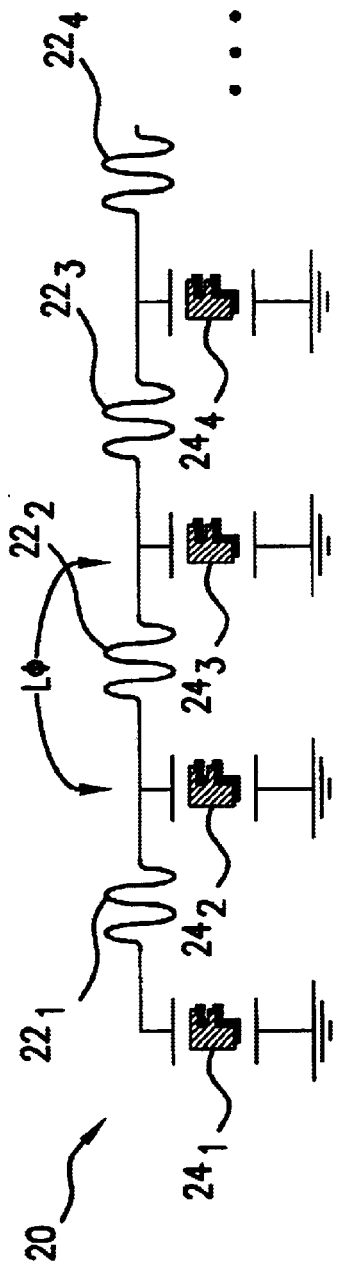

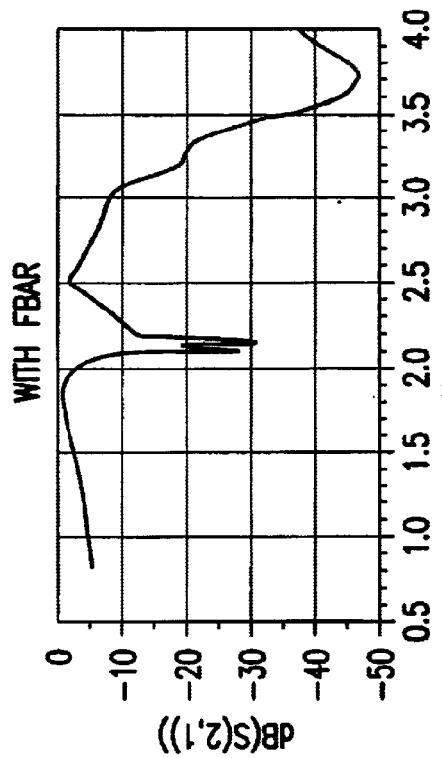
FIG. 5A PRIOR ART
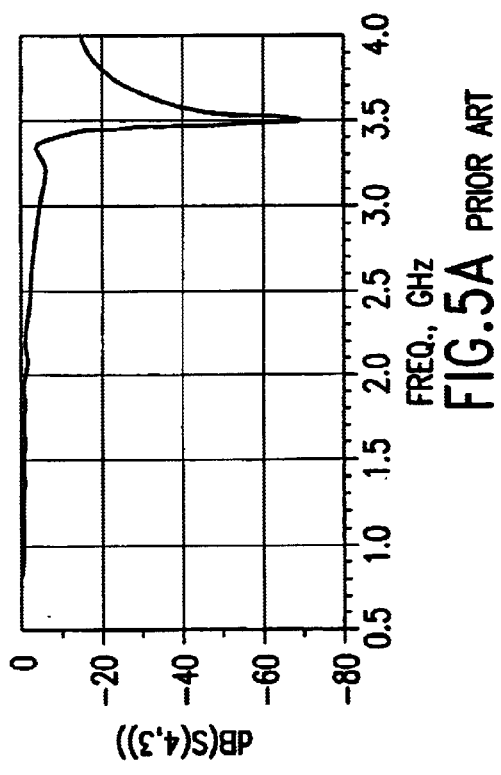
FIG. 5B
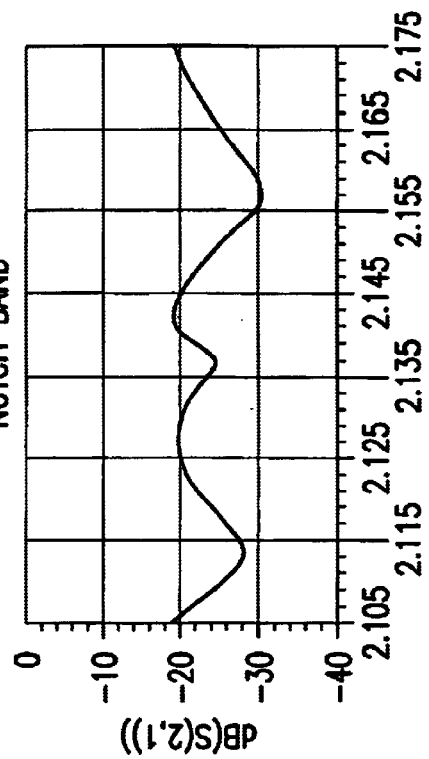
FIG. 5C PASS BAND
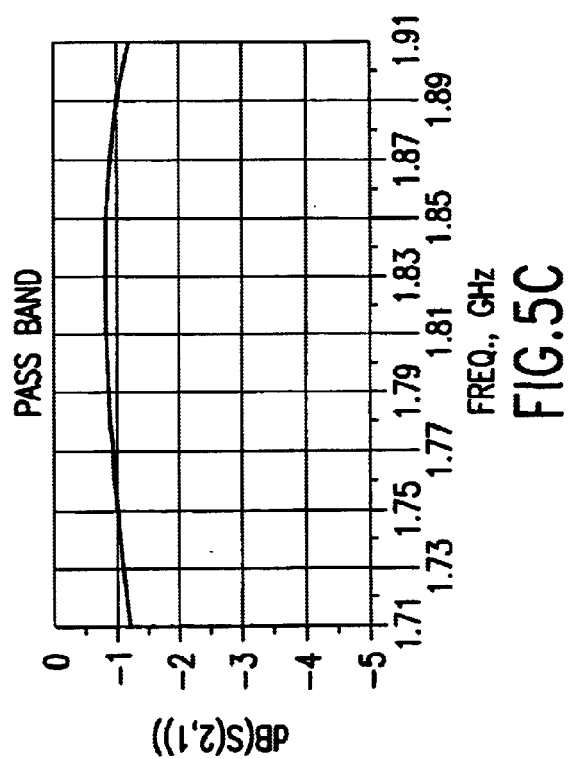
FIG. 5D NOTCH BAND

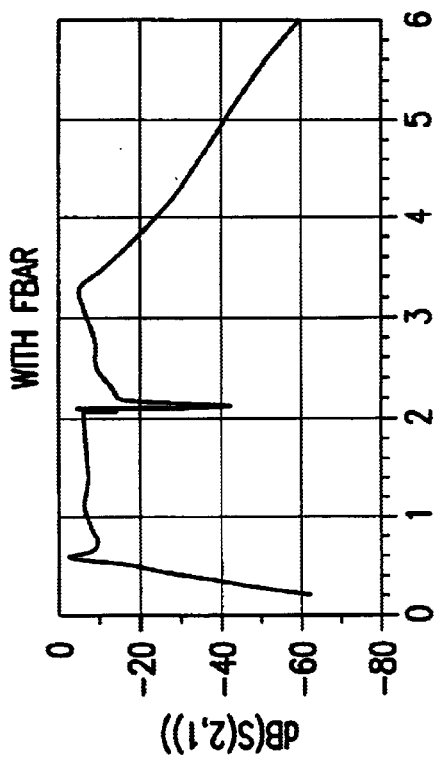
FIG.8B WITH FBAR
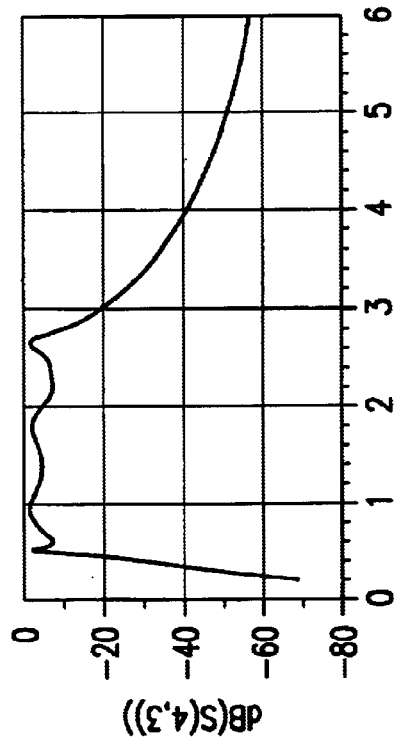
FIG.8A PRIOR ART
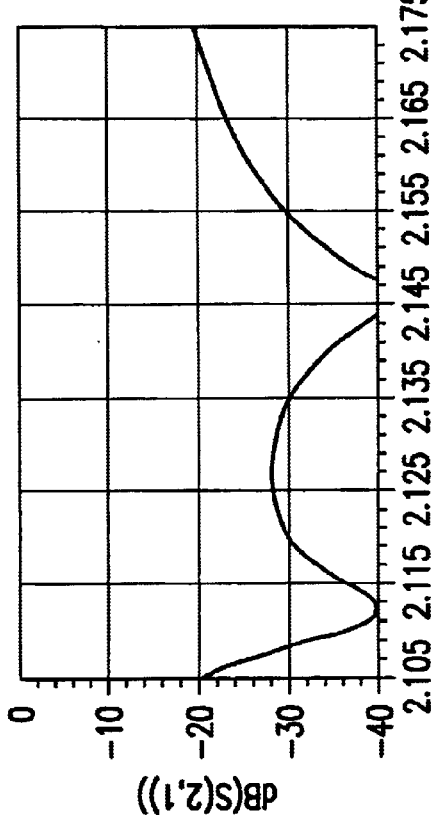
FIG.8C NOTCH BAND

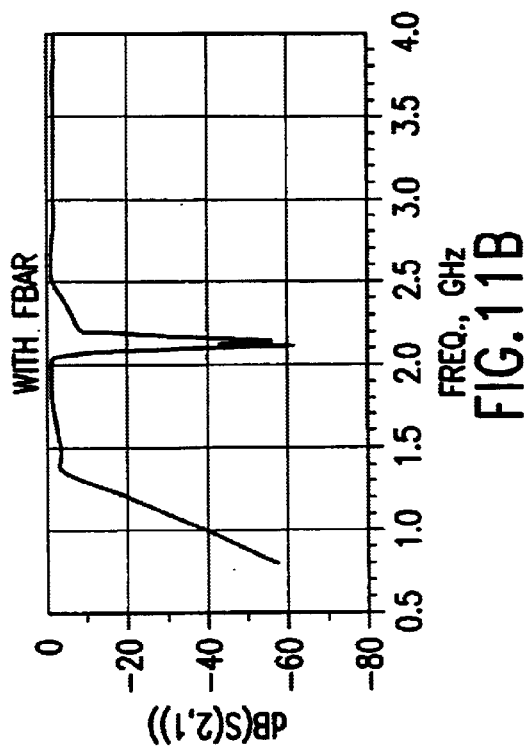
FIG.11B WITH FBAR
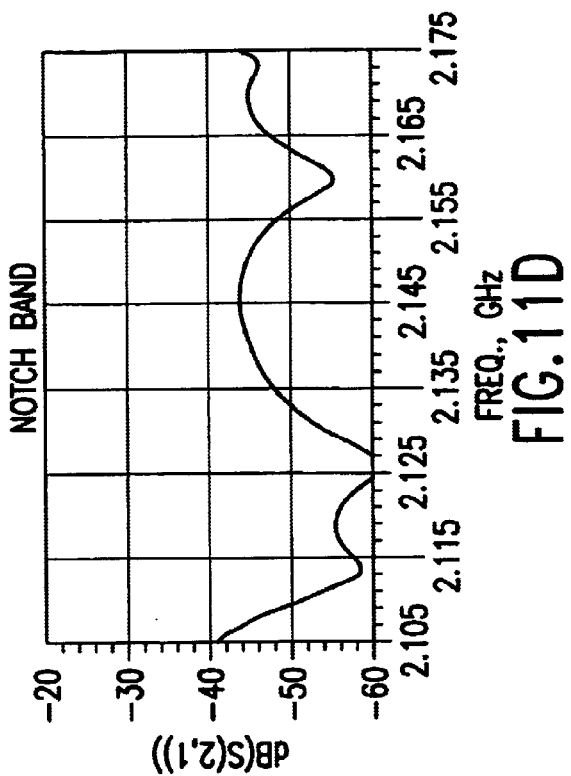
FIG.11D NOTCH BAND
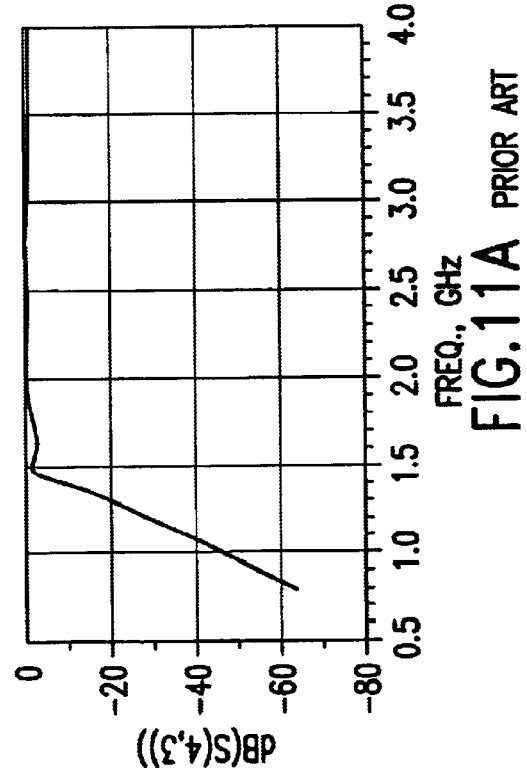
FIG.11A PRIOR ART
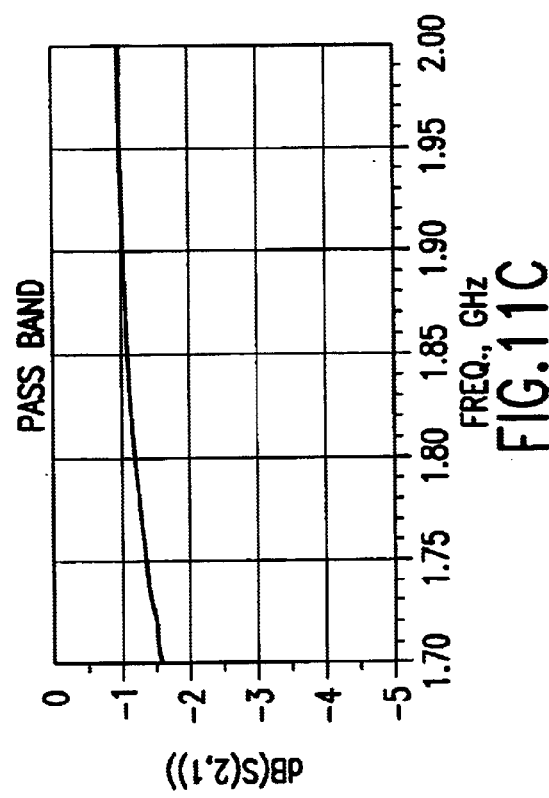
FIG.11C PASS BAND

INTEGRATED FILTER AND IMPEDANCE MATCHING NETWORK

BACKGROUND

Inductors (L) and capacitors (C) are universally used in electronics for numerous functions. One function is to provide low loss impedance transformation. Another is to provide low loss filtering.

The various components in a circuit all have physical constraints. A low noise amplifier (LNA), for example, has a very high impedance input, with a moderate impedance output. Typically, standard impedance is set for interfacing components, say 50 Ω. A low loss matching network transforms the 50 Ω to the impedance that the LNA requires at the input. Another matching network then transforms the output of the LNA back to 50 Ω. These matching networks are some combination of inductors and capacitors.

Often one set of frequencies must be passed on to further circuitry, while another set of frequencies are to be blocked. This function can be synthesized using inductors and capacitors. An example of such a circuit is called a low pass filter, and can be built using a chain of capacitors connected to ground, and inductors connected to the capacitors and each other. This is shown in FIG. 1 (prior art).

It is also possible to build both functions into one structure. To illustrate, a low pass filter could also transform one impedance to another.

SUMMARY

Filters that include acoustic resonators in lieu of the traditional capacitors have an additional notch structure in the filter response. This notch structure attenuates a selected frequency band.

In a first circuit topology, a filter includes serially connected inductors. Between at least two of the inductors, an acoustic resonator interposes the node and ground. The resonant frequency of the acoustic resonator is notched out in the frequency response. In another embodiment, for at least one acoustic resonator, an inductor interposes the resonator and ground.

In a second circuit topology, a filter includes serial pairs that are serially connected. Each serial pair includes a serially connected acoustic resonator and inductor. A parallel pair connects between each serial pair and ground. Each parallel pair includes an acoustic resonator and inductor connected in parallel.

In a third circuit topology, a filter includes serially connected acoustic resonators. Between at least two of the acoustic resonators, an inductor interposes the node and ground. The resonant frequency of the acoustic resonators result in the desired notch in the frequency response.

In all of the embodiments, the acoustic resonator may be a film bulk acoustic resonator or a surface acoustic wave resonator.

BRIEF DESCRIPTION OF THE DRAWINGS

FIG. 3 illustrates a double notch filter of the present invention.

FIG. 4 illustrates an all pass/low pass notch filter of the present invention.

FIG. 5A illustrates the frequency response of the prior art all pass filter shown in FIG. 1. Corresponding to the embodiment shown in FIG. 4, FIG. 5B illustrates the frequency response, FIG. 5C illustrates the passband frequency response, and FIG. 5D illustrates the notch frequency response.

FIG. 8A illustrates the frequency response of the prior art filter shown in FIG. 6. Corresponding to the embodiment shown in FIG. 7, FIG. 8B illustrates the frequency response and FIG. 8C illustrates the notch frequency response.

FIG. 11A illustrates the frequency response of the prior art filter shown in FIG. 9. Corresponding to the embodiment shown in FIG. 10, FIG. 11B illustrates the frequency response, FIG. 11C illustrates the passband frequency response, and FIG. 11D illustrates the notch frequency response.

DETAILED DESCRIPTION

Acoustic Resonators, e.g. surface acoustic wave resonators (SAWs) and film bulk acoustic resonators (FBARS) have two major aspects. The first aspect is their resonant nature. It is easiest to describe this behavior in the frequency domain. Acoustic resonators have two resonant frequencies. The resonator is well behaved, then quickly becomes a short circuit, then rapidly an open circuit, and thereafter is well behaved. Where the resonator is well behaved, its operation is similar to that of a simple capacitor. The second aspect is this capacitor.

In the present invention, FBARs replace the capacitors in a traditional LC filter. These new filters have the same response as before, but now with an additional notch structure in the frequency response.

Figure 1:
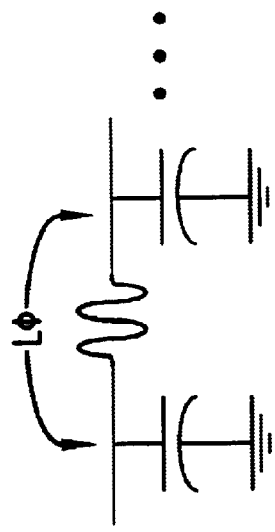
FIG. 1 is a prior art all pass filter.

A prior art all pass filter or transmission line is shown in FIG. 1. The impedance of each section is a function of the inductance and the capacitance. Specifically:

$$Z_o = \sqrt{\frac{L}{C}} \qquad \text{Equation 1}$$

When all the sections have the same impedance as the source and load, the structure functions as a phase shifter. The phase shift increases as more sections are connected in series. Changing the impedance of the sections causes the structure to transform the impedance from the source to the load. In one example, a line would have sections with impedance of 13.25 Ω, and a phase length of 90° at some frequency. This would then also act as an impedance transformer, transforming between 3.5 Ω and 50 Ω.

Figure 2:
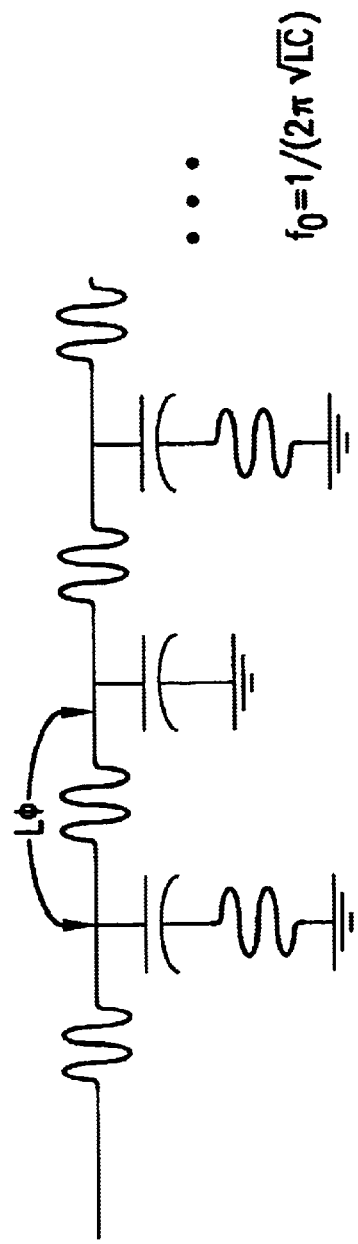
FIG. 2 is a prior art notch filter.

This structure can also have a lowpass frequency response. Replacing some of the capacitors in FIG. 1 with resonators, as in FIG. 2, results in a notch filter. At the frequency of resonance, the resonator is a short circuit. The resonator frequency is a function of L and C, specifically:

$$f_o = \frac{1}{2\pi\sqrt{LC}} \qquad \text{Equation 2}$$

The transmission line, as a whole, changes impedance, interfering with the passage of any signal present. The resonators may be selected to short circuit at the second harmonic, for example. The resulting frequency response will be notched out the second harmonic. In one embodiment, having an impedance of 13.25 Ω, and a phase length of 90°, the matching network both transforms 3.5 Ω to 50 Ω and notches out the second harmonic. This is a typical matching structure for a power amplifier. As long as the signal to be rejected is an octave removed from the passband, implementing this filter with lumped elements is practical. The variability and lossy nature of the available capacitors and inductors limits how much filtering can be done close to the passband.

FIG. 3 illustrates a double notch filter 10 of the present invention. The filter includes a plurality of inductors $12_x$ electrically connected in series. At least one acoustic resonator $14_x$ is connected to at least two of the inductors $12_x$, $12_{x+1}$ and ground. A second plurality of inductors $16_x$ interposes at least one of the acoustic resonators and ground.

A resonator behaves similar to a capacitor outside of its resonant frequency. So, replacing the capacitors with FBARs does not affect the performance of the filter. However, the FBAR has its own self-resonance. At this self-resonant frequency, the resonator quickly transitions from capacitor to short circuit to open circuit and back to capacitor. This FBAR resonance will deliver open and short circuits independent of the standard LC resonator. This results in a structure with an additional notch, a notch with the characteristics delivered by a very high quality resonator. This notch can be much sharper and closer to the pass band than is possible with ordinary inductors and capacitors. This is now a double notch filter transformer (shown in FIG. 3). The structure could pass all the high range GSM transmit bands (1710 to 1910 MHz); notch out the second harmonics (3420 to 3820 MHz) with the LC resonators; transform the impedance from 3.5 Ω to 50 Ω and notch out the UMTS Rx band (2110 to 2170 MHz) with the FBARs.

FIG. 4 illustrates an all pass/low pass notch filter 20 of the present invention. The filter 20 includes a plurality of inductors $22_x$ electrically connected in series. At each node of the plurality, an acoustic resonator $24_x$, e.g. FBAR, connects between at least one of the inductors $22_x$ and ground.

FIGS. 5A–D illustrate the frequency response of the prior art all pass filter shown in FIG. 1 and frequency response of the present invention shown in FIG. 4. FIG. 5A illustrates the frequency response of the prior art filter shown in FIG. 3. FIGS. 5B–D are directed towards the novel filter shown in FIG. 4. FIG. 5B illustrates the frequency response. FIG. 5C illustrates the passband frequency response. FIG. 5D illustrates the notch frequency response.

Figure 6:
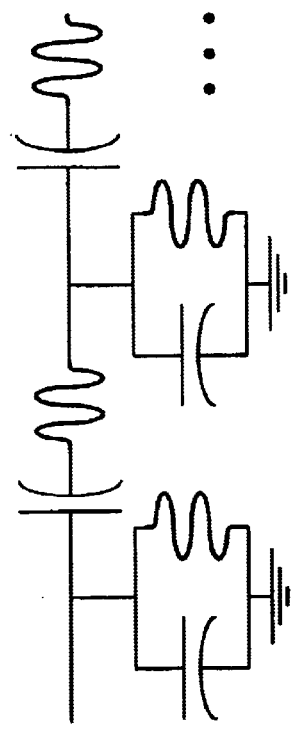
FIG. 6 illustrates a prior art lumped element bandpass filter.

FIG. 6 illustrates a prior art lumped element bandpass filter.

Figure 7:
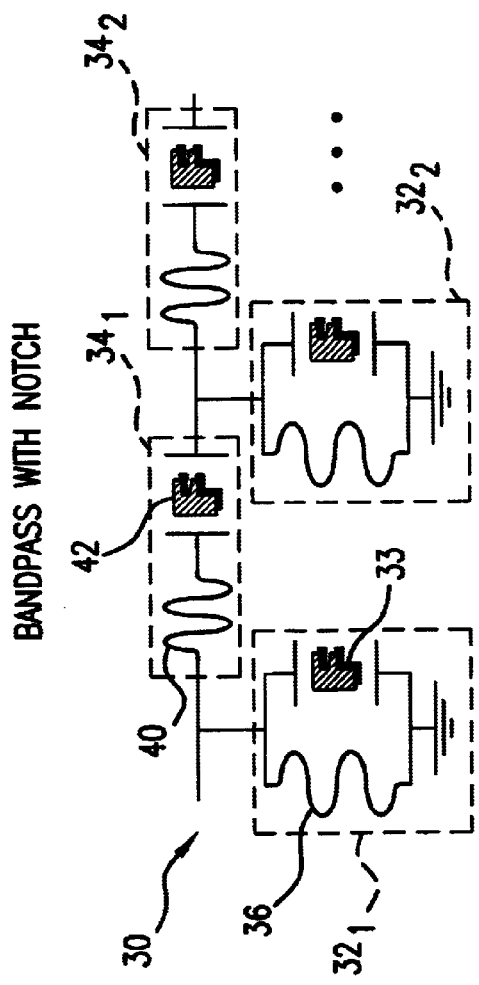
FIG. 7 illustrates a bandpass with notch filter of the present invention.

FIG. 7 illustrates a bandpass with notch filter 30 of the present invention. The filter 30 includes a first plurality of stages $32_x$ and a second plurality of stages $34_x$, connected such that the stages of each plurality alternate. For the first plurality, each stage, is connected to ground, includes an inductor 36 and resonator 38 that are connected in parallel. For the second plurality, each stage includes an inductor 40 and resonator 42 are electrically connected in series.

FIGS. 8A–C illustrate the frequency response of the prior art band pass filter shown in FIG. 6 and frequency response of the present invention shown in FIG. 7. FIG. 8A illustrates the frequency response of the prior art filter shown in FIG. 6. FIGS. 8B–C are directed towards the novel filter shown in FIG. 7. FIG. 8B illustrates the frequency response. FIG. 8C illustrates the notch frequency response.

Figure 9:
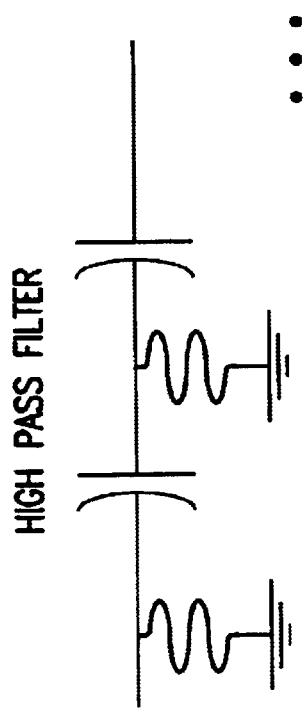
FIG. 9 illustrates a prior art high pass filter.

FIG. 9 illustrates a prior art high pass filter.

Figure 10:
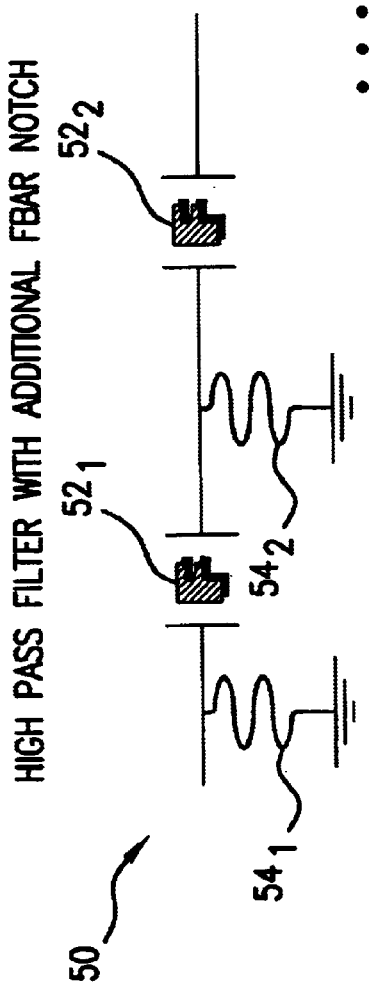
FIG. 10 illustrates a high pass filter with additional resonator notch of the present invention.

FIG. 10 illustrates a high pass with notch filter 50 of the present invention. The filter includes a plurality of acoustic resonators 52x that electrically connected in series. At each node of the plurality, an inductor 54x connected between the node and ground.

FIGS. 11A–D illustrate the frequency response of the prior art high pass filter shown in FIG. 9 and frequency response of the present invention shown in FIG. 10. FIG. 11A illustrates the frequency response of the prior art filter shown in FIG. 9. FIGS. 11B–D are directed towards the novel filter shown in FIG. 10. FIG. 10B illustrates the frequency response. FIG. 10C illustrates the passband frequency response. FIG. 10D illustrates the notch frequency response.

The innovation is to create a new class of filters utilizing film bulk acoustic resonators in two manners. The first is to utilize the bulk capacitor that forms the resonator as a capacitor in a filter network. The second manner is to use the resonator as a resonator to notch out a particular frequency. This combination results in a filter characteristics otherwise be fabricated.

What is claimed is:

1. A filter comprising:

a first plurality of acoustic resonators electrically connected in series;

a first plurality of inductors, each inductor connecting between at least one of the acoustic resonators and ground;

a second plurality of inductors, each inductor interposing two of the plurality of acoustic resonators; and a second plurality of resonators, each resonator connected in parallel to one of the first plurality of inductors;

wherein at least one frequency is notched out in the frequency response.

2. A filter, as defined in claim 1, wherein one of the first and second pluralities of acoustic resonators is selected from a group that includes film bulk acoustic resonators and surface wave resonators.

* * * * *